United States Patent
Vermeer

(10) Patent No.: US 10,514,609 B2
(45) Date of Patent: Dec. 24, 2019

(54) LITHOGRAPHIC APPARATUS AND METHOD FOR PREVENTING PERIPHERAL EXPOSURE OF A SUBSTRATE

(71) Applicant: KULICKE & SOFFA LITEQ B.V., Eindhoven (NL)

(72) Inventor: Adrianus Johannes Petrus Maria Vermeer, Eindhoven (NL)

(73) Assignee: KULICKE & SOFFA LITEQ B.V., Eindhoven (NL)

( * ) Notice: Subject to any disclaimer, the term of this patent is extended or adjusted under 35 U.S.C. 154(b) by 0 days.

(21) Appl. No.: 16/074,971

(22) PCT Filed: Feb. 15, 2017

(86) PCT No.: PCT/NL2017/050088
§ 371 (c)(1),
(2) Date: Aug. 2, 2018

(87) PCT Pub. No.: WO2017/142401
PCT Pub. Date: Aug. 24, 2017

(65) Prior Publication Data
US 2019/0033722 A1    Jan. 31, 2019

(30) Foreign Application Priority Data

Feb. 16, 2016  (NL) .................................... 2016271
Feb. 15, 2017  (WO) .............. PCT/NL2017/050088

(51) Int. Cl.
*G03F 7/20*  (2006.01)

(52) U.S. Cl.
CPC ........ *G03F 7/7025* (2013.01); *G03F 7/70733* (2013.01)

(58) Field of Classification Search
CPC ............................ G03F 7/70216; G03F 7/7025
See application file for complete search history.

(56) References Cited

U.S. PATENT DOCUMENTS

| | | | |
|---|---|---|---|
| 6,680,774 B1 | 1/2004 | Heinle | |
| 7,777,863 B2 * | 8/2010 | Smeets | G03F 7/707 |
| | | | 355/72 |

(Continued)

FOREIGN PATENT DOCUMENTS

WO    2014055582 A1    4/2014

OTHER PUBLICATIONS

International Search Report, dated Jun. 29, 2017 for related PCT/NL2017/050088, filed on Feb. 15, 2017.

*Primary Examiner* — Steven Whitesell Gordon
(74) *Attorney, Agent, or Firm* — Preti Flaherty Beliveau & Pachios LLP

(57) ABSTRACT

A lithographic apparatus (10) and method for preventing exposure of a peripheral portion (P) of a substrate (S). An edge mask (M) has a radial concave edge (E) that extends over less than half a circle arch. The edge mask (M) is connected to a mask carrier (4) that circumnavigates the projection system (2) to adjust a tangential coordinate (Φ) and a radial coordinate (R) of the edge mask (M) with respect to the optical axis (A) of the projection system (2) for inserting the edge mask (M) at a variable distance into the beam of radiation (B). The tangential and radial positions (Φ,R) of the edge mask (M) are coordinated with a changing position (X,Y) of the substrate (S) to prevent exposure of the peripheral portion (P) of the substrate (S) during exposure of the target region (T).

16 Claims, 4 Drawing Sheets

(56) References Cited

U.S. PATENT DOCUMENTS

| | | |
|---|---|---|
| 7,808,612 B2 | 10/2010 | Wakker et al. |
| 7,936,447 B2 | 5/2011 | Derksen et al. |
| 2008/0252871 A1* | 10/2008 | Sato ................. G03B 27/72 |
| | | 355/66 |
| 2015/0234281 A1* | 8/2015 | Gardner ............. G03F 7/70066 |
| | | 355/30 |

* cited by examiner

LITHOGRAPHIC APPARATUS AND METHOD FOR PREVENTING PERIPHERAL EXPOSURE OF A SUBSTRATE

TECHNICAL FIELD AND BACKGROUND

The present disclosure relates to a lithographic apparatus and method for preventing exposure of a peripheral portion of a substrate.

For example, U.S. Pat. No. 6,680,774 B1 describes a method and apparatus for mechanically masking a workpiece to form exposure exclusion regions. The apparatus includes a mask that is arranged atop the photosensitive surface of the workpiece. The mask is opaque to the wavelength of radiation that activates the photosensitive workpiece surface. The mask is placed onto the workpiece prior to lithographic exposure of the workpiece so that the photosensitive material (e.g., negative acting photoresist) can be removed from select regions of the workpiece to provide, for example, electrical contact directly to the workpiece upper surface. e.g. mask edge to make electrical contact.

However, placement of the mask in U.S. Pat. No. 6,680,774 requires the ring to be transferred above and across the width of the substrate. This action requires a relatively large movement of the mask relative to the substrate which provides a time constraint into the operation, especially as the mask must be placed on the substrate following loading onto a substrate support and subsequently removed before the substrate can be unloaded. Furthermore, as the mask is transferred across the substrate there is always a risk of contamination of the substrate, for example from dust or other particles falling from the mask.

To remedy these problems, U.S. Pat. No. 7,936,447 describes a mask that includes a plurality of discrete segments arranged to form a continuous ring shaped mask positioned between an outer region of a substrate and an illumination system. A mask support is connected to the substrate table and configured to couple the mask to the substrate table, the mask support comprising a mask drive mechanism arranged to adjust the position of the mask relative to the substrate table in a direction substantially perpendicular to the substrate table. However the added mass of the mask and drive mechanism may negatively impact movement of the substrate table. Alternatively, when a ring shaped mask, segmented ring, or a diaphragm arrangement is positioned proximal to the reticle, the ring needs to move in synchronicity with the substrate. This may be more difficult since the projection system typically reduces the image size of the reticle, and in that case the ring needs to be bigger and requires larger strokes of movement. The known mechanisms may thus negatively impact cycle time e.g. of a lithography stepper device.

Alternatively, U.S. Pat. No. 7,777,863 describes a substrate table comprising a substrate support surface and a rail which at least partly circumnavigates the substrate support surface. A mask to prevent exposure of a peripheral exposure region of the substrate is attached to a moveable carrier arranged to travel along the rail which circumnavigates the substrate support surface. The moveable carrier may be configured to be moveable towards and away from the center of the substrate table, such that the mask may overhang the peripheral exposure region of the substrate during exposure of the substrate by the lithographic apparatus, and may then be moved away so that it no longer overhangs the substrate, thereby allowing the substrate to be easily removed from the substrate table. However, the mask and drive mechanism may still negatively impact cycle time, since these elements add mass and footprint to the wafer table.

It is desired to provide an improved lithographic apparatus and method for preventing exposure of a peripheral portion of a substrate while maintaining substrate cleanliness with minimal impact on cycle time.

SUMMARY

According to one aspect the present disclosure provides a lithographic apparatus. The apparatus comprises a substrate table configured to hold a substrate. The apparatus comprises a projection system configured to project a beam of radiation onto a target region of the substrate. The apparatus comprises a substrate drive mechanism configured to adjust a position of the substrate with respect to the projection system. The apparatus comprises an edge mask for preventing exposure of a peripheral portion of the substrate. The edge mask has a radial concave edge that extends over less than half a circle arch. The edge mask is constructed and arranged to cause a projected shadow in the peripheral portion when the edge mask is inserted into the beam of radiation. The apparatus comprises a mask carrier attached to the edge mask. The mask carrier comprises a mask drive mechanism configured to adjust a position of the mask carrier that at least partially circumnavigates the projection system. This allows to adjust a tangential coordinate of the edge mask for inserting the edge mask from a variable direction into the beam of radiation. The drive mechanism is further configured to adjust a radial coordinate of the edge mask for inserting the edge mask at a variable distance into the beam of radiation. The apparatus comprises a controller configured to control the mask drive mechanisms. The controller is programmed to coordinate the tangential and radial positions of the edge mask with the position of the substrate to prevent exposure of the peripheral portion of the substrate during exposure of the target region.

Advantageously, the edge mask according to the present setup does not limit movement of the substrate table and may move along a different path than the substrate table through a combined radial/tangential path. The stroke length of the path can be relatively short thus causing minimal disturbance. By providing a rail that circumnavigates the projection system, rather than the substrate table, the equipment including the rail, mask carrier, edge mask, and mask drive mechanisms can be independent from the substrate table. The rail can be connected to a stationary frame which can be more robust. When the mask carrier receives power and/or control signals via the stationary rail, tangling of wires can be avoided. When the rail is connected to the projection system the edge mask may be accurately moved with respect to the projected beam. Even though the substrate table is allowed to move with respect to the projection system and the fixed rail, nevertheless the position of the edge mask can be adjusted to cover the peripheral portion using tangential and radial drive mechanisms wherein a continuously variable angle as well as a continuously variable distance of the edge mask can be set. One advantage may be that the Z-position of the mask (in focus direction) can be fixed just above the focus plane, e.g. as opposed to a construction built on the wafer table, no adjustment is needed for thickness of the substrate.

For example, the mask carrier may be driven along a rail circumnavigating the projection system to adjust a tangential coordinate of the edge mask and comprising a linear stage to adjust a radial position of the edge mask. Also other constructions can be envisaged to adjust the tangential and radial coordinates, independently, or in combination. For example, the mask carrier comprises a pair of concentric rings that are each independently rotatable around a central position, and a pivotable element attached to the edge mask, wherein the pivotable element is engaged between the concentric rings. Accordingly, the pivotable element is configured to rotate the edge mask with a first coordinate around the central position when the concentric rings are both rotated over the same angle. In addition, the pivotable element is configured to rotate the edge mask with a second coordinate around a pivot point that is radially offset from the central position when the concentric rings are relatively rotated with respect to each other with a different angle. The first and second coordinates can be converted to radial and tangential coordinates of the edge mask, or vice versa, as desired. It will be appreciated that a system comprising only rotatable elements may be more easily isolated from the surroundings compared to a system comprising linear stages. The rotatable element may be comprised in a closed box wherein only a small hole in the box is needed for an arm attached to the edge mask. To further prevent contamination, an under-pressure may be applied to the box. The mask carrier box may be inserted into the beam path as needed, and removed when no longer needed.

For example, the controller can be programmed to calculate a position and orientation of the projected shadow with respect to a centre of the substrate based on the position of the substrate and the coordinates of the edge mask. The tangential mask drive mechanism can be used to adjust the tangential coordinate of the edge mask to rotate the edge mask until the projected shadow of the radial concave edge faces a centre of the substrate. In this way the radial concave edge has the correct orientation with respect to the edge of the substrate. The radial mask drive mechanism can be used to adjust the radial coordinate of the edge mask to shift the edge mask towards the centre of the substrate until the projected shadow of the radial concave edge overlays the inner radius of the peripheral portion. In this way exposure of the peripheral portion of the substrate is prevented.

Preferably, the radial mask drive mechanism is configured to variably adjust the radial coordinate of the edge mask transverse to the rail. The present configuration that allows setting a variable distance of the edge mask into the beam, may be distinguished from a carrier attached to the substrate table which need only be moveable between a fixed (overhanging) position and a free position. It will be appreciated that in the present disclosure, because the overhanging edge mask is not connected to the substrate table, the substrate loading which can take place elsewhere, remains unhindered anyway. By setting the radial range of motion to allow movement between at least an outer position where the edge mask is completely free from blocking the beam of radiation and an inner position where the edge mask is able to cast its projected shadow over at least half the target region, in principle any portion of the beam may in principle be covered.

By shaping the radial concave edge covering less than half a circle arch such that the projected shadow has an edge radius matching an inner radius of the peripheral portion, the peripheral region may be precisely excluded. By setting a width of the radial concave edge larger than a width of the beam of radiation at the position where the edge mask is inserted into the beam of radiation, also the projected image should in principle be adequately covered. The projected shadow can be particularly accurate when the edge mask is near a focal plane of the projection system. For example, the edge mask may be disposed close to a surface of the substrate or an object plane of the projection system, e.g. near a patterning device. This is a fixed height with respect to the projection lens, so no Z-movement of the mask is required.

When the lithographic apparatus is configured to provide multiple exposures of the same pattern onto different target regions of the substrate, e.g. stepping mode, it may be advantageous to adjust the tangential and radial positions of the edge mask between each exposure. For example, mask drive mechanisms may move the mask carrier at the same time as the substrate drive mechanism is moving the substrate table. In this way no cycle time is lost. Since the mask can be relatively small, it may be more easily moved. When the lithographic apparatus is configured to move the substrate with respect to the projection system during exposure of a target region, e.g. scanning mode, the tangential and radial positions of the edge may be adjusted during the exposure.

According to another or further aspect, the present disclosure provides a method for preventing exposure of a peripheral portion of a substrate. The method comprises projecting a beam of radiation onto a target region of the substrate. The method comprises providing an edge mask for preventing exposure of the peripheral portion of the substrate. The edge mask has a radial concave edge that extends over less than half a circle arch, wherein the edge mask is shaped to cause a projected shadow in the peripheral portion when the edge mask is inserted into a beam of radiation. The method comprises providing a mask drive mechanism to adjust a position of a mask carrier that at least partially circumnavigates the projection system to adjust a tangential coordinate of the edge mask attached to the mask carrier with a range of motion that at least partially circumnavigates an optical axis of the projection system for inserting the edge mask from a variable direction into the beam of radiation. The method comprises providing a mask drive mechanism to adjust a radial coordinate of the edge mask with respect to the optical axis of the projection system for inserting the edge mask at a variable distance into the beam of radiation. The method comprises controlling the mask drive mechanisms to coordinate the tangential and radial positions of the edge mask with a changing position of the substrate to prevent exposure of the peripheral portion of the substrate during exposure of the target region.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1:
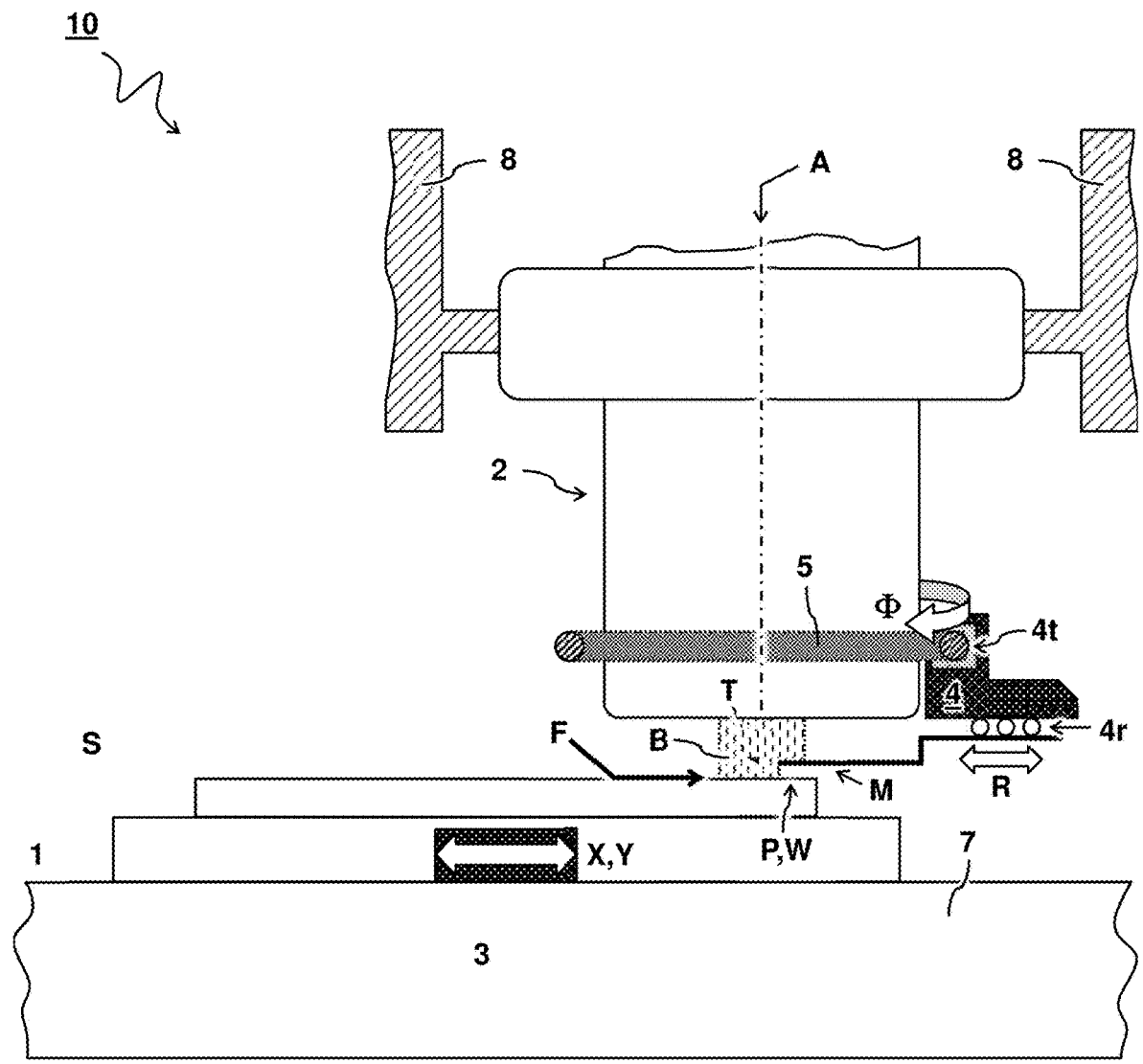
FIG. 1 shows a schematic side view of a lithographic apparatus.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise.

The invention is described more fully hereinafter with reference to the accompanying drawings, in which embodiments of the invention are shown. The description of the exemplary embodiments is intended to be read in connection with the accompanying drawings, which are to be considered part of the entire written description. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIG. 1 shows a schematic side view of an embodiment of a lithographic apparatus 10.

The apparatus 10 comprises a substrate table 1 configured to hold a substrate S. The apparatus 10 comprises a projection system 2 configured to project a beam of radiation B onto a target region T of the substrate S. A substrate drive mechanism 3 is configured to adjust a position of the substrate S on a support surface 7 with respect to the projection system 2, e.g. according to Cartesian coordinates X,Y. The apparatus 10 comprises an edge mask M for preventing exposure of a peripheral portion P of the substrate S. The edge mask M is attached to a mask carrier 4.

The mask carrier 4 comprises a tangential mask drive mechanism 4$t$ and a radial mask drive mechanism 4$r$. The tangential mask drive mechanism 4$t$ is configured to adjust a position of the mask carrier 4 along a rail 5 that at least partially circumnavigates the projection system 2 to adjust a tangential coordinate Φ of the edge mask M. This provides the edge mask M with a range of motion that at least partially circumnavigates an optical axis A of the projection system 2 for inserting the edge mask M from a variable direction into the beam of radiation B. The radial mask drive mechanism 4$r$ is configured to adjust a radial coordinate R of the edge mask M with respect to the optical axis A of the projection system 2 for inserting the edge mask M at a variable distance into the beam of radiation B. The edge mask M is constructed and arranged to cause a projected shadow W in the peripheral portion P when the edge mask M is inserted into the beam of radiation B.

In one embodiment, the mask carrier 4 is powered and/or controlled by an electrical connection via the rail 5. Preferably, the rail 5 is stationary, i.e. connected to a stationary frame. It will be understood that this connection may be established directly or through intermediate (stationary) structures or components. For example, the rail 5 may be connected directly to the external frame 8 that in this case also supports the projection system 2. However, preferably the rail 5 is connected directly to the projection system 2 so that it has a fixed position with respect to the optical axis A that is at the centre of the projection system 2. In general, the optical axis is an imaginary line that defines the path along which light propagates through the projection system 2, up to first approximation. For a projection system 2 composed of simple lenses and mirrors, the axis may pass through the centre of curvature of each surface and/or may coincide with the axis of rotational symmetry.

In one embodiment, the mask carrier 4 is configured to hold the edge mask M near a focal plane F of the projection system 2. For example, the mask carrier 4 is configured to hold the edge mask M close to a surface of the substrate S to cast a sharp shadow W. For example, a distance between the edge mask M and the focal plane and/or substrate is less than five millimetres, preferably less than two millimetres, e.g. between a tenth of a millimetre and one millimetre. In another embodiment, the mask carrier 4 is configured to hold the edge mask M close to an object plane of the projection system 2 (not shown).

Detailed descriptions of well-known devices and methods may be omitted here so as not to obscure the description of the present systems and methods. For example, although not shown here, the apparatus 10 typically comprises or is coupled to an illumination system configured to provide the beam of (actinic) radiation B. The system may also comprise other common components such as a reticle and corresponding stage for patterning the beam of radiation B. The projection system 2 itself may comprise various optical components such as lenses and (curved) mirrors to shape and direct the beam of radiation B. Also a loading stage for placing the substrate S on the substrate table 1 may be present.

Figure 2:
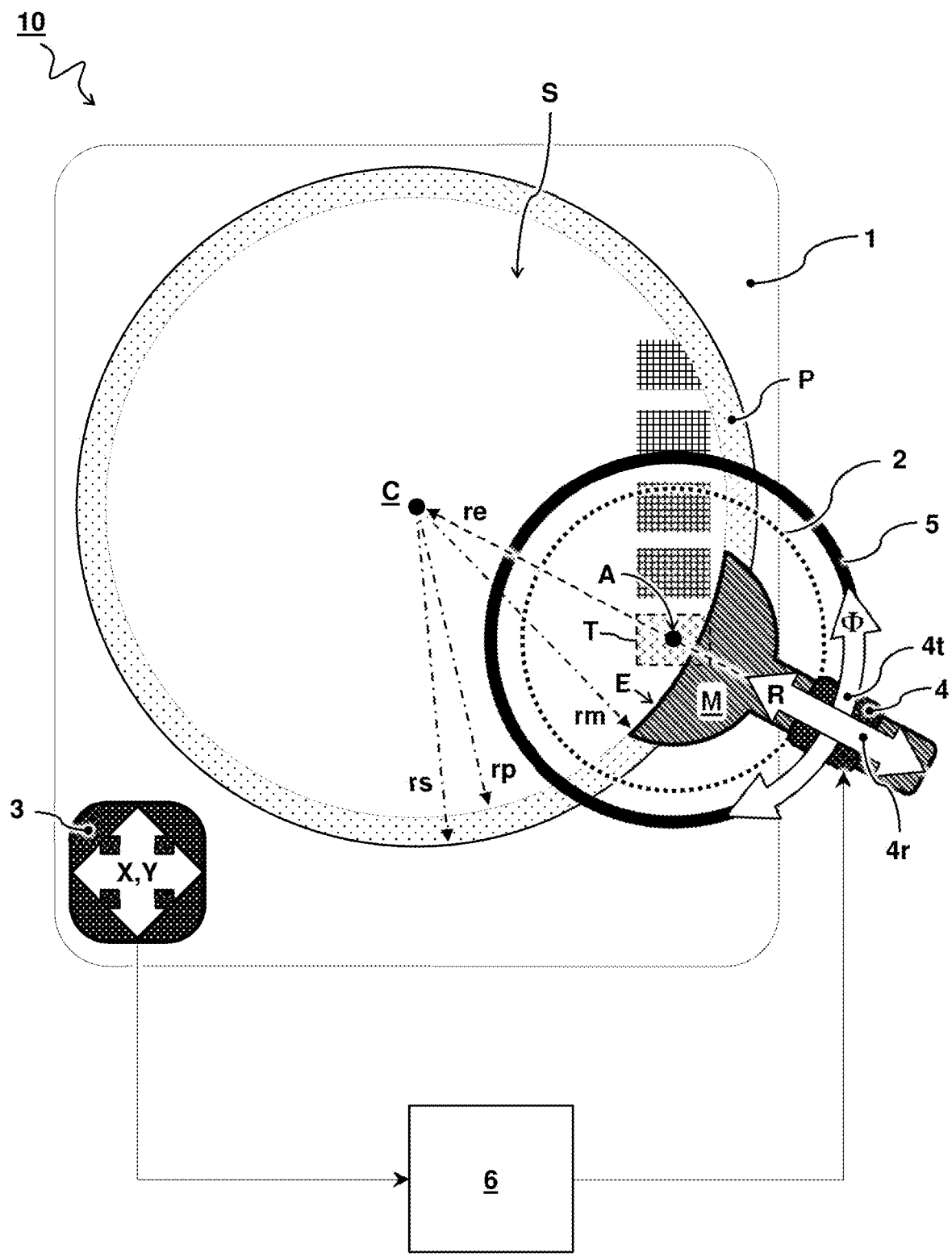
FIG. 2 shows a schematic top view of the lithographic apparatus.

FIG. 2 shows a schematic top view of an embodiment of the lithographic apparatus 10.

This view shows that the edge mask M has a radial concave edge E. The radial edge extends over less than half a circle arch, preferably over as little arch length as needed to sufficiently cover at least part of the beam irradiating the target region T. Preferably a width of the radial concave edge E is at least larger than a width of the beam of radiation at the position where the edge mask M is inserted into the beam of radiation. The edge mask M comprises a surface that is opaque to the beam of radiation. The edge mask M is thus constructed and arranged to cause a projected shadow in the peripheral portion P when the edge mask M is inserted into the beam of radiation (which may correspond to the target region T in this case).

In the embodiment, the apparatus 10 comprises a controller 6 configured to control the tangential and radial mask drive mechanisms 4$t$,4$r$ of the mask carrier 4. The controller is configured to coordinate the tangential and radial positions Φ,R of the edge mask M with the position X,Y of the substrate S to prevent exposure of the peripheral portion P of the substrate S during exposure of the target region T. The substrate S has a radius "rs". For example, the controller may comprise a computer readable medium with program instructions that when executed by the controller cause it to control the mask drive mechanisms in accordance with the present methods and systems. Of course the programming may also be embodied in hardware circuitry e.g. an FPGA.

In one embodiment, the controller 6 is programmed to calculate a position and orientation of the projected shadow W with respect to a centre C of the substrate S based on the position X,Y of the substrate S and the coordinates Φ,R of the edge mask M. In another or further embodiment, the controller 6 is programmed to control the tangential mask drive mechanism 4$t$ to adjust the tangential coordinate Φ of the edge mask M to rotate the edge mask M until the projected shadow W of the radial concave edge E faces a centre C of the substrate S wherein a radial line "re" transverse to the shadow of the radial concave edge E intersects the centre C of the substrate S. In another or further embodiment, the controller 6 is programmed to control the radial mask drive mechanism 4r to adjust the radial coordinate R of the edge mask M to shift the edge mask M towards or away from the centre C of the substrate S until the projected shadow W of the radial concave edge E overlays the inner radius rp of the peripheral portion P.

In one embodiment, the radial mask drive mechanism 4r is configured to variably adjust the radial coordinate R of the edge mask M transverse to the rail 5. For example the radial coordinate R may be variably set, i.e. at a plurality of three of more positions in a range between an outer position where the edge mask M is completely free from blocking the beam of radiation B and an inner position where the edge mask M is able to cast its projected shadow W over at least half the target region T, preferably even further to completely cover the target region T. Accordingly, in the inner position, the edge mask M covers at least up to the centre of the projected beam and/or target region T.

In one embodiment, the projected shadow W of the radial concave edge E has an edge radius rm matching an inner radius rp of the peripheral portion P. In the present embodiment, the edge mask M is near the substrate S which causes the projected shadow W to have virtually the same size as the edge mask M (except for possibly small half shadow effects). In general, the edge mask M may also be situated in another focal plane of the projection system 2 in which case there may be a magnification or reduction of the size of the projected shadow W compared to the size of the edge mask M.

FIGS. 1 and 2 disclose a method for preventing exposure of a peripheral portion P of a substrate S. The method comprises projecting a beam of radiation B onto a target region T of the substrate S. The method comprises providing an edge mask M for preventing exposure of the peripheral portion P of the substrate S, wherein the edge mask M has a radial concave edge E that extends over less than half a circle arch and wherein the edge mask M is shaped to cause a projected shadow W in the peripheral portion P when the edge mask M is inserted into a beam of radiation B. The method comprises providing a tangential mask drive mechanism 4t to adjust a position of a mask carrier 4 along a rail 5 that at least partially circumnavigates the projection system 2 to adjust a tangential coordinate Φ of the edge mask M attached to the mask carrier 4 with a range of motion that at least partially circumnavigates an optical axis A of the projection system 2 for inserting the edge mask M from a variable direction into the beam of radiation B. The method comprises providing a radial mask drive mechanism 4r to adjust a radial coordinate R of the edge mask M with respect to the optical axis A of the projection system 2 for inserting the edge mask M at a variable distance into the beam of radiation B. The method comprises controlling the tangential and radial mask drive mechanisms 4t,4r to coordinate the tangential and radial positions Φ,R of the edge mask M with a changing position X,Y of the substrate S to prevent exposure of the peripheral portion P of the substrate S during exposure of the target region T.

Figure 3A:
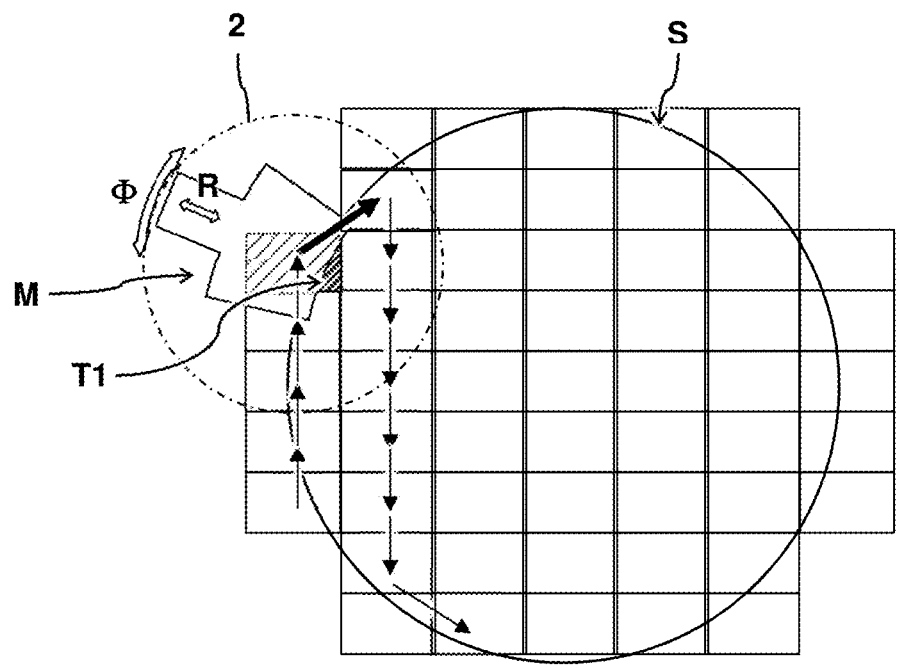
FIGS. 3A and 3B schematically illustrate repositioning of the mask carrier for different exposures.
Figure 3B:
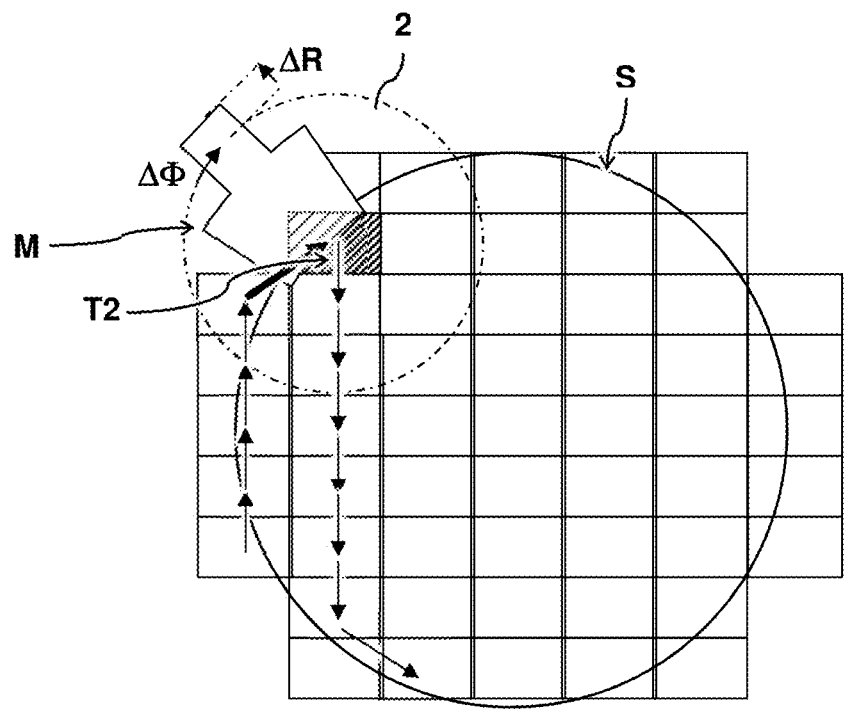

FIGS. 3A and 3B schematically illustrate repositioning of the edge mask M for different exposures.

In one embodiment, the lithographic apparatus 10 is configured to provide multiple exposures of the same pattern onto different target regions T1,T2 of the substrate S. For example, the controller is configured to adjust the tangential and radial positions Φ,R of the edge mask M between each exposure. In another or further embodiment, the controller is configured to calculate destination values for the radial and tangential coordinates R,Φ based on a destination for the position X,Y of the substrate S in the next exposure. In another or further embodiment, the controller 6 is configured to control the tangential and radial mask drive mechanisms 4t,4r to move the mask carrier to the destination values for the radial and tangential coordinates R,Φ at the same time as the substrate drive mechanism is moving the substrate table 1. It will be appreciated that not every exposure necessary requires the presence of the edge mask M in the beam. Typically, this is only needed for exposures where the target region T partially overlaps the peripheral portion. In one embodiment difference values ΔΦ and ΔR may be calculated and controller may drive the mechanisms accordingly to move to the next position. Advantageously, the angular and radial differences may be relatively small between different exposures. In one embodiment, the lithographic apparatus 10 is configured to move the substrate S with respect to the projection system 2 during exposure of a target region T. For example, the controller 6 is configured to adjust the tangential and radial positions Φ,R of the edge mask M during the exposure.

Figure 4A:
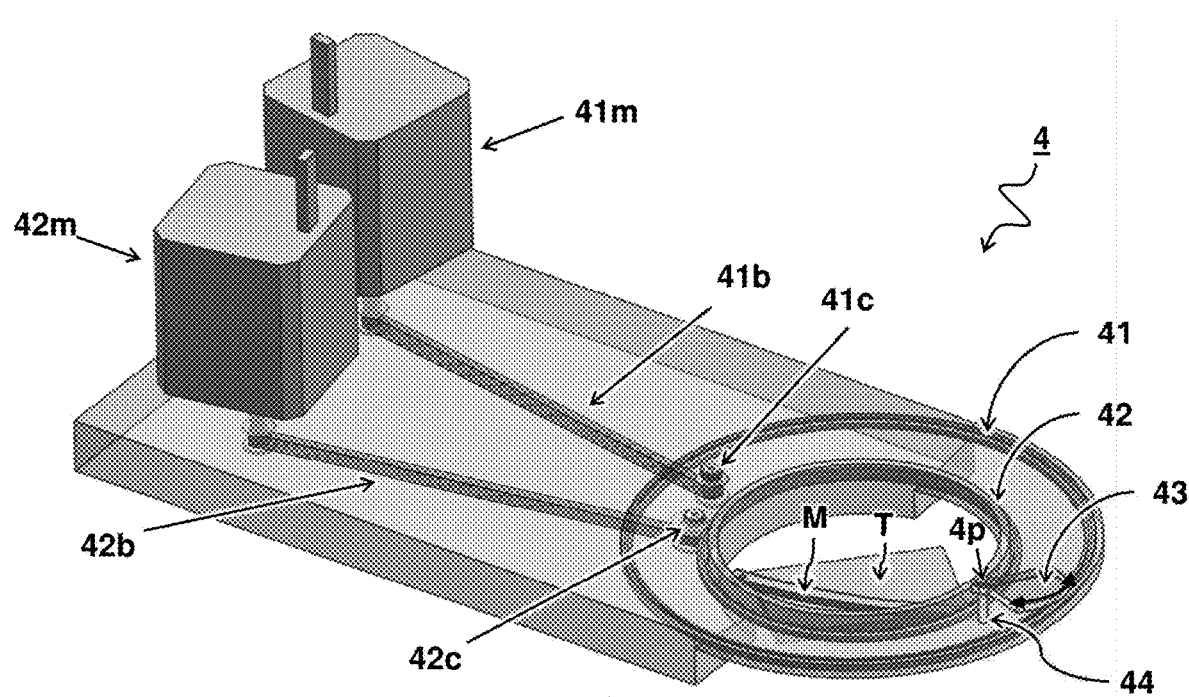
FIGS. 4A and 4B schematically illustrate an embodiment of a mask carrier for positioning an edge mask in a light beam.
Figure 4B:
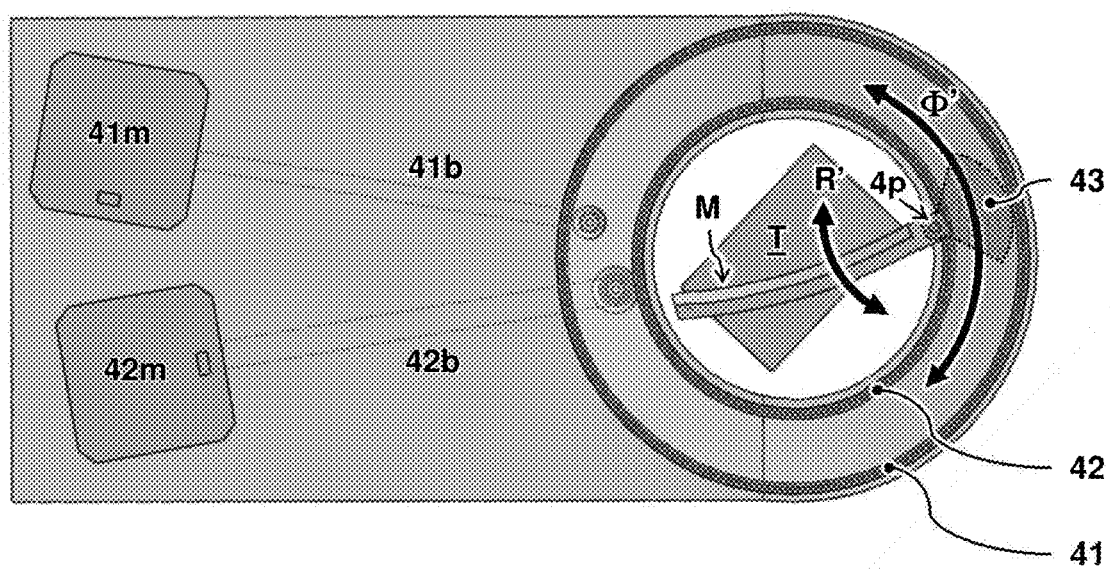

FIGS. 4A and 4B schematically illustrate an embodiment of a mask carrier 4 for positioning an edge mask M in a light beam (not shown) at a desired position in a target region T of a wafer (not shown)

In one embodiment, the mask carrier 4 comprises a pivotable element 43 attached to the edge mask M. In another or further embodiment, the pivotable element 43 is engaged to a pair of concentric rings 41,42 that are each independently rotatable around a central position. The concentric rings comprise a central opening to let the beam of radiation (not shown) pass there through). In one embodiment, the mask drive mechanism 41m,42m is configured to independently drive the concentric rings 41,42.

For example the pivotable element 43 is rotatably connected at a pivot point 4p disposed on the inner ring 41 and comprises teeth that engage corresponding teeth of the outer ring 42. Accordingly, the pivotable element 43 is configured to rotate the edge mask M with a first coordinate Φ' around the central position when the concentric rings 41,42 are both rotated over the same angle. Furthermore, the pivotable element 43 is configured to rotate the edge mask M with a second coordinate R' around a pivot point 4p that is radially offset from the central position when the concentric rings 41,42 are relatively rotated with respect to each other with a different angle. Also other embodiments may be envisaged, e.g. the pivotable element 43 may comprise a cog wheel attached that engages teeth of both the inner and outer rings.

In one embodiment, the mask carrier 4 is driven by motors 41m,42m that are positioned at a distance from the edge mask M. This has the general advantage that heat production by the motors is kept away from the projection area. For example, the motors drive may drive elements of the mask carrier 4 via a system of driving belts 41b,42b. For example, in the shown embodiment, the cogs 41c,42c are driven as a result of the moving belts 41b,42b and engage the outer and inner rings 42,41, respectively, to drive the pivotable element 43 and thereby the edge mask M. Of course also variations of the shown systems and methods may be envisaged.

For the purpose of clarity and a concise description, features are described herein as part of the same or separate embodiments, however, it will be appreciated that the scope of the invention may include embodiments having combinations of all or some of the features described. For example, while embodiments were shown for a particular shape and positioning of the edge mask, also alternative ways may be envisaged by those skilled in the art having the benefit of the present disclosure for achieving a similar function and result. E.g. optical and electrical components may be combined or split up into one or more alternative components. It is appreciated that this disclosure offers particular advantages to lithography, and in general can be applied for any application wherein exposure of a substrate edge needs to be prevented.

Finally, the above-discussion is intended to be merely illustrative of the present systems and/or methods and should not be construed as limiting the appended claims to any particular embodiment or group of embodiments. The specification and drawings are accordingly to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. A lithographic apparatus comprising:
a substrate table configured to hold a substrate;
a projection system configured to project a beam of radiation onto a target region of the substrate;
a substrate drive mechanism configured to adjust a position of the substrate with respect to the projection system;
an edge mask for preventing exposure of a peripheral portion of the substrate, wherein the edge mask has a radial concave edge that extends over less than half a circle arch, wherein the edge mask is constructed and arranged to cause a projected shadow in the peripheral portion when the edge mask is inserted into the beam of radiation;
a mask carrier attached to the edge mask, wherein the mask carrier comprises a mask drive mechanism configured to adjust a position of the mask carrier, wherein the position is adjustable to allow the mask carrier to at least partially circumnavigate the projection system to adjust a tangential coordinate of the edge mask for inserting the edge mask from a variable direction into the beam of radiation, and wherein the mask drive mechanism is further configured to adjust a radial coordinate of the edge mask for inserting the edge mask at a variable distance into the beam of radiation; and
a controller configured to control the mask drive mechanism and programmed to coordinate tangential and radial positions of the edge mask with the position of the substrate to prevent exposure of the peripheral portion of the substrate during exposure of the target region;
wherein the mask carrier comprises a pivotable element attached to the edge mask and engaged with a pair of concentric rings that are each independently rotatable around a central position, wherein the concentric rings form a central opening at the central position for allowing the beam of radiation to pass there through, wherein the mask drive mechanism is configured to independently drive the concentric rings;
wherein the pivotable element is configured by its engagement to the concentric rings to rotate the edge mask with a first coordinate around the central position when the concentric rings are both rotated over the same angle; and
wherein the pivotable element is configured by its engagement to the concentric rings to rotate the edge mask with a second coordinate around a pivot point that is radially offset from the central position to variably block part of the central opening when the concentric rings are relatively rotated with respect to each other with a different angle.

2. The lithographic apparatus according to claim 1, wherein the controller is programmed to control the mask drive mechanism to adjust the tangential coordinate of the edge mask to rotate the edge mask until the projected shadow of the radial concave edge faces a centre of the substrate; and to adjust the radial coordinate of the edge mask to shift the edge mask towards or away from the centre of the substrate until the projected shadow of the radial concave edge overlays an inner radius of the peripheral portion.

3. The lithographic apparatus according to claim 1, wherein the mask drive mechanism is configured to variably adjust the radial coordinate of the edge mask between an outer position where the edge mask is completely free from blocking the beam of radiation and an inner position where the edge mask is able to cast its projected shadow over at least half the target region.

4. The lithographic apparatus according to claim 1, wherein the projected shadow of the radial concave edge has an edge radius matching an inner radius of the peripheral portion.

5. The lithographic apparatus according to claim 1, wherein a width of the radial concave edge is larger than a width of the beam of radiation at the position where the edge mask is inserted into the beam of radiation.

6. The lithographic apparatus according to claim 1, wherein the mask carrier is moveably connected to a stationary frame.

7. The lithographic apparatus according to claim 1, wherein the mask carrier is configured to hold the edge mask near a focal plane of the projection system.

8. The lithographic apparatus according to claim 1, wherein the mask carrier is configured to hold the edge mask close to a surface of the substrate.

9. The lithographic apparatus according to claim 1, wherein the lithographic apparatus is configured to provide multiple exposures of a same pattern onto different target regions of the substrate, wherein the controller is configured to adjust the tangential and radial positions of the edge mask between each exposure.

10. The lithographic apparatus according to claim 1, wherein the controller is configured to calculate destination values for the radial and tangential coordinates based on a destination for the position of the substrate in the next exposure.

11. The lithographic apparatus according to claim 1, wherein the controller is configured to control the mask drive mechanism to move the mask carrier at the same time as the substrate drive mechanism is moving the substrate table.

12. The lithographic apparatus according to claim 1, wherein the lithographic apparatus is configured to move the substrate with respect to the projection system during exposure of a target region, wherein the controller is configured to adjust the tangential and radial positions of the edge mask during the exposure.

13. The lithographic apparatus according to claim 1, wherein the mask carrier is attached to the projection system.

14. The lithographic apparatus according to claim 1, wherein the mask carrier is configured to move along a rail attached to the projection system.

15. The lithographic apparatus according to claim 14, wherein the mask carrier is powered and/or controlled by an electrical connection via the rail.

16. A method for preventing exposure of a peripheral portion of a substrate, the method comprising
- projecting a beam of radiation onto a target region of the substrate on a substrate table;
- providing an edge mask for preventing exposure of the peripheral portion of the substrate, wherein the edge mask has a radial concave edge that extends over less than half a circle arch, wherein the edge mask is shaped to be held at an exposure position in the beam of radiation to cause a projected shadow in the peripheral portion when the edge mask is inserted into the beam of radiation;
- providing a mask carrier attached to the edge mask, wherein the mask carrier comprises a mask drive mechanism separate from the substrate table and configured to adjust the exposure position of the edge mask, as the edge mask is held in the beam of radiation, independent of a position of the substrate table, wherein a position of the mask carrier is adjustable to allow the mask carrier to at least partially circumnavigate a projection system to adjust a tangential coordinate of the edge mask for inserting the edge mask from a variable direction into the beam of radiation, and to adjust a radial coordinate of the edge mask for inserting the edge mask at a variable distance into the beam of radiation,
- wherein the mask carrier comprises a pivotable element attached to the edge mask and engaged with a pair of concentric rings that are each independently rotatable around a central position, wherein the concentric rings form a central opening at the central position for allowing the beam of radiation to pass there through, wherein the mask drive mechanism is configured to independently drive the concentric rings;
- wherein the pivotable element is configured by its engagement to the concentric rings to rotate the edge mask with a first coordinate around the central position when the concentric rings are both rotated over the same angle; and
- wherein the pivotable element is configured by its engagement to the concentric rings to rotate the edge mask with a second coordinate around a pivot point that is radially offset from the central position to variably block part of the central opening when the concentric rings are relatively rotated with respect to each other with a different angle; and
- controlling the mask drive mechanism to coordinate tangential and radial positions of the edge mask with a changing position of the substrate to prevent exposure of the peripheral portion of the substrate during exposure of the target region.

* * * * *